United States Patent [19]

Doyle et al.

[11] Patent Number: 5,387,530
[45] Date of Patent: Feb. 7, 1995

[54] THRESHOLD OPTIMIZATION FOR SOI TRANSISTORS THROUGH USE OF NEGATIVE CHARGE IN THE GATE OXIDE

[75] Inventors: Brian S. Doyle, Framingham, Mass.; Ara Philipossian, Redwood Shores, Calif.

[73] Assignee: Digital Equipment Corporation, Maynard, Mass.

[21] Appl. No.: 85,002

[22] Filed: Jun. 29, 1993

[51] Int. Cl.⁶ .................................... H01L 21/265
[52] U.S. Cl. .................................. 437/45; 437/37; 437/21; 437/43
[58] Field of Search ................. 437/45, 21, 37, 42; 148/43

[56] References Cited

U.S. PATENT DOCUMENTS

| | | | |
|---|---|---|---|
| 3,328,210 | 6/1967 | McCaldin et al. | 437/37 |
| 3,624,466 | 11/1971 | Schnable | 317/235 |
| 3,787,251 | 1/1974 | Brand et al. | 148/187 |
| 3,849,204 | 11/1974 | Fowler | 148/1.5 |
| 3,852,120 | 12/1974 | Johnson et al. | 148/1.5 |
| 3,933,530 | 1/1976 | Mueller et al. | 148/1.5 |
| 4,047,974 | 9/1977 | Harari | 437/37 |
| 4,566,173 | 1/1986 | Gössler et al. | 437/45 |
| 4,804,640 | 2/1989 | Kaganowicz et al. | 437/42 |
| 5,231,045 | 7/1993 | Miura et al. | 437/21 |
| 5,264,721 | 11/1993 | Gotou | 257/349 |

FOREIGN PATENT DOCUMENTS 308814A 3/1989 European Pat. Off. .

OTHER PUBLICATIONS

Wolf et al., vol. I & II, Silicon Processing for the VLSI Era, Latice Press 1986.
Wolf, S. "Silicon Processing for the VLSI ERA", Lattice Press, Sunset Beach, Calif., vol. 2 1990.

Primary Examiner—Tom Thomas
Assistant Examiner—Lynne A. Gurley
Attorney, Agent, or Firm—James F. Thompson; Ronald C. Hudgens; Albert P. Cefalo

[57] ABSTRACT

Threshold optimization for SOI transistors is achieved through the formation of a layer of charge within the gate oxide, which layer has a polarity corresponding to that of the ion implantation for threshold voltage control. A negative charge layer is formed by furnishing trace amounts of aluminum on the substrate before growth of an oxide to form a portion of the gate oxide. The aluminum will form a charge layer on the surface of the oxide and an additional oxide is then deposited on the same to form the gate oxide as a sandwich with the charge layer in the same.

1 Claim, 1 Drawing Sheet

THRESHOLD OPTIMIZATION FOR SOI TRANSISTORS THROUGH USE OF NEGATIVE CHARGE IN THE GATE OXIDE

BACKGROUND OF THE INVENTION

The present invention relates to integrated circuitry and, more particularly, to affecting the threshold voltage of integrated circuit devices.

Silicon-on-insulator (SOI) technology has been developed for forming transistors and other electrical devices in integrated circuitry. An SOI differs from more common bulk semiconductors in that the active region (the region in which the semiconductor electrical devices are formed) is a semiconductor layer separated from a semiconductor base by a dielectric region. If the semiconductor is silicon as is common, the dielectric typically is silicon dioxide. The active region of the SOI then becomes the layer of silicon which exists between the dielectric (or, in other words, the insulator) and the surface.

Use of SOI technology has the advantage of simplifying isolation of various electrical devices. Moreover, SOI transistors have low parasitic capacitance, low leakage currents, soft error immunity, etc. However, to obtain the full advantage of SOI, it is desirable that if the device is a transistor, it be fully depleting, i.e., that surface depletion extend through the active region to the dielectric region. Full depletion has many advantages, including providing higher mobility for the passage of charge, and it provides integrated circuitry having continuous current/voltage characteristics.

One problem with reducing the thickness of the active region in line with integrating semiconductor devices, is that the doping concentration necessary for threshold control of transistors formed on the active region may prevent full depletion. In this connection, the factor that governs the extent to which the surface depletion level extends into the active region is the concentration of dopants in such region. The high concentration which has been believed to be necessary to provide a desired threshold voltage prevents full depletion when the transistor gate oxide is thin. For example, if the oxide has a thickness of 50 Å units and it is desired that the threshold voltage be maintained at 0.5 V, the doping concentration for such threshold voltage is about $3 \times 10^{17}/cm^3$. With this thickness, a fully depleted device requires for the transistor to be fully depleting an active region thickness of the order of 500 Å. Such a thickness might not be compatible with the optimization of devices as the function of the devices would have a thickness of 500 Å and their resistance will be high. If thick active regions are used, many of the advantages of silicon-on-insulator (SOI) transistors are lost.

SUMMARY OF THE INVENTION

The present invention reduces the threshold voltage charge which must be provided in an active region to control the operation of a device. It does this by incorporating a charge within the gate oxide of the device. Thus, from the broad standpoint the method of the invention includes the step of intentionally providing a charge within a gate oxide of an integrated circuit device. It is particularly applicable to silicon-on-insulator (SOI) devices. As mentioned previously, to obtain the full advantage of an SOI device it is necessary that the active region be fully depleting. Incorporating charge within the gate oxide reduces the concentration of dopant in the active region that is necessary to achieve a given threshold voltage.

The invention includes steps that have been discovered to enable a negative charge to be incorporated easily within the gate oxide. The invention also includes the product resulting from the method.

Other features and advantages of the invention either will become apparent or will be described in connection with the following, more detailed description of preferred embodiments of the invention.

BRIEF DESCRIPTION OF THE DRAWING

With reference to the accompanying drawing.

DETAILED DESCRIPTION OF THE INVENTION

The following relatively detailed description is provided to satisfy the patent statutes. However, it will be appreciated by those skilled in the art that various changes and modifications can be made without departing from the invention.

Figure 1:
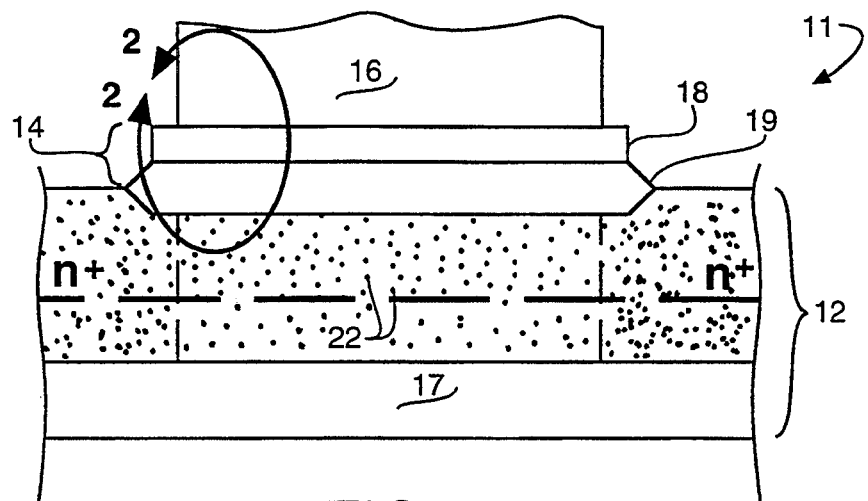
FIG. 1 is an idealized, schematic sectional view of partly fabricated integrated circuitry illustrating a preferred embodiment of the invention.

A portion of a silicon-on-insulator (SOI) transistor is generally referred to in FIG. 1 by the reference numeral 11. Within this portion, a negative charge layer of the invention is formed within the gate oxide. With reference to such figure, a silicon-on-insulator substrate 12 is partly illustrated having both a gate oxide 14 and a polysilicon gate 16 of a transistor thereon. While the SOI substrate can be formed by any convenient mode utilized in the industry, in submicron technology such a substrate often is formed by ion implantation of an oxygen species, followed by thermal annealing to produce a buried oxide layer represented at 17. In this particular embodiment the silicon wafer is of n-type silicon as is illustrated.

As mentioned previously, although silicon-on-insulator transistors have been developed in the past, it is desirable that the SOI material in the transistor active region be fully depleted so that one can obtain the full advantages of SOI technology. Typically, a means is provided to permit some control over or the establishment of the value of the threshold voltage. The common approach is to use ion implantation to provide ions of the appropriate charge at the surface of a substrate. The difficulty with this approach with silicon-on-insulator technology is that as the thickness of the gate oxide is significantly reduced, the implantation dosage required to permit a typical threshold voltage to be attained, is quite high. If such a high dosage implantation is used, the SOI devices will be prevented from becoming fully depleted.

The present invention tackles the above problem by incorporating charge in the gate oxide of a transistor to reduce (or in the extreme case entirely eliminate) the ion implantation dosage required for the establishment of a threshold voltage. To this end, in the embodiment of the invention depicted by FIGS. 1 and 2, the gate oxide is provided as two layers 18 and 19 between which a charged layer 21 (see FIG. 2) is provided. This construction results in the negative charge not only being inside the gate oxide but also close to the substrate-gate oxide interface. That is, it is spaced sufficiently far from the gate 16 to act to provide the capacitance necessary for threshold voltage.

Figure 2:
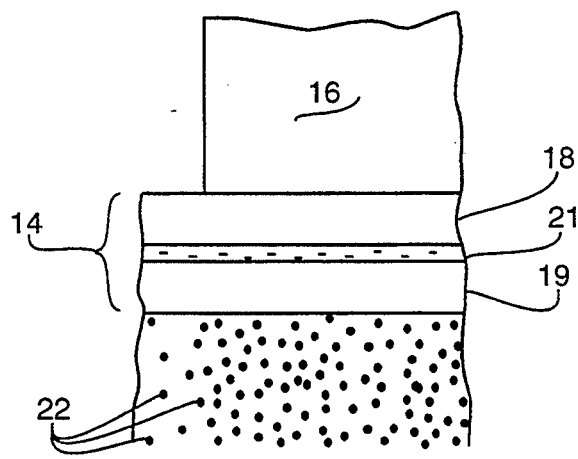
FIG. 2 is a significantly enlarged view, showing the encircled portion of FIG. 1.

It is to be noted that it is not intended that the charge layer provide all of the charge necessary for establishing a threshold voltage. Rather, standard ion implantation in the substrate is combined with the effect of the charge layer to provide threshold voltage. This ion implantation for threshold voltage purposes is indicated in FIGS. 1 and 2 by dots 22.

The required dosage concentration for the ion implantation to achieve threshold control is significantly reduced in view of the provision of the charge layer. For example, when the charge layer is provided with a concentration of negative charge equal to about $1.5 \times 10^{12}$ atoms/cm$^2$ and the doping concentration in the silicon need only be about $5 \times 10^{16}$ atoms/cm$^3$ for a threshold voltage of 0.5 volts. This enables the thickness of the silicon to be reduced to 0.1 $\mu$m and yet be fully depleting when the gate oxide is about 65 Å thick.

Charge layer 21 can be formed in various ways. For example, if trace amounts of aluminum are provided on a substrate before growth of an oxide, a negative charge will be formed on the surface of the oxide. In this connection, it has been found that during pre-diffusion cleaning of wafers, the presence of aluminum in pre-diffusion wafer cleaning solutions such as NH$_4$OH and H$_2$O$_2$ results in the transportation of aluminum from the chemical bulk onto the surface of the wafers. See Kato et al., "Investigation of the Charge Observed in Thermal Oxide Films Originating from SC-1 Precleaning", J. Electrochem. Soc., Vol. 139, pp. 1756–1759 (1992); and Mertens et al., "Contamination and Ultra Cleaning", Proceedings of the Annual Technical Meeting of the Institute of Environmental Sciences, Nashville, Tenn. (1992). This phenomenon can be exploited in the instant invention. That is, the lowermost portion 19 of the gate oxide can be grown on a substrate whose surface has been contaminated to provide the layer 21. It has been found that from the aluminum content of the chemicals one can easily determine the aluminum content on the surface of the wafer and, thus, provide a desired negative charge. The charge layer 21 can be covered with further silicon dioxide which is deposited, to form the layer 18.

Figure 3:
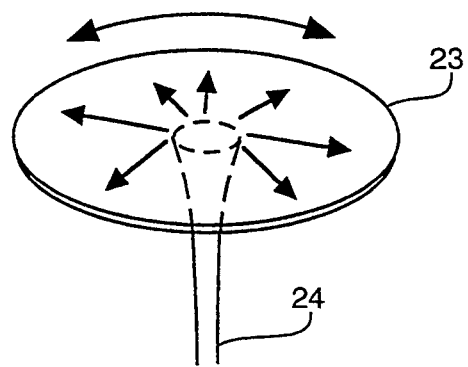
FIG. 3 is an idealized view of the method of application of the material responsible for a negative charge.

Aluminum can also be introduced on the surface of the substrate via a spin technique. This is represented in FIG. 3 in which a substrate wafer 23 is shown on the chuck 24 of a spinner. The spinner is provided with a fixed amount of a dilute aluminum solution. This solution is dispensed on the wafer 23 and allowed to remain on its surface for a short period of time, e.g., about one minute. The solution is then spun off of the wafer surface, leaving the wafer dry but contaminated with aluminum. Thus a controlled amount of aluminum (and hence negative charge) is provided on the active surface of the substrate. The thermal oxide layer 19 is then grown on the substrate. The result is the formation of the negative charge layer 21. The layer 18 is then deposited on the same in a conventional manner.

While to this point the invention has been described in connection with the formation of a negative charge layer, it is equally applicable to the formation of a positive charge layer. In such an arrangement, the finished construction is essentially the same in appearance as the construction when the charge layer is negative. However, in a preferred arrangement the silicon-on-insulator is a p-type. Moreover, the charge layer 21 is formed by sulfur ions. The desired positive charge is introduced into the gate oxide by treating the substrate with an aqueous H$_2$SO$_4$/H$_2$O$_2$ solution following the traditional pre-oxidation cleaning procedures. An oxide layer 19 is thermally grown in a conventional manner. The sulfur and, hence, the positive charge will be concentrated at its surface. The oxide layer 19 then can be formed via conventional deposition.

The positive charge is quite stable and does not degrade over time. In addition, subsequent high temperature oxidations and/or anneals as the integrated circuitry is being formed do not reduce the extent of the positive charge. The inclusion of the positive charge reduces the ion implantation concentration necessary to enable the desired threshold voltage to be established.

As mentioned at the beginning of the detailed description, applicants are not limited to the specific embodiment described above. Various changes and modifications can be made. The claims, their equivalents and their equivalent language define the scope of protection.

What is claimed is:

1. A method, comprising the steps of:

forming a silicon-on-insulator (SOI) substrate having an active region thickness of approximately 1000 angstroms;

forming on said SOI substrate a gate insulator layer having a thickness of approximately 65 angstroms and including an inner layer located in approximately the middle thereof and having an areal density of negative charge of approximately $1.5 \times 10^{12}$ electrons per square centimeter; and doping the region of said substrate beneath said gate insulator layer with an n-type dopant to a volumetric dopant density of approximately $5 \times 10^{16}$ dopant atoms per cubic centimeter.

* * * * *